United States Patent
Park

(10) Patent No.: US 8,143,667 B2
(45) Date of Patent: Mar. 27, 2012

(54) SEMICONDUCTOR DEVICE HAVING NON-VOLATILE MEMORY AND METHOD OF FABRICATING THE SAME

(75) Inventor: Sung-Chul Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 137 days.

(21) Appl. No.: 12/614,465

(22) Filed: Nov. 9, 2009

(65) Prior Publication Data

US 2010/0074023 A1 Mar. 25, 2010

Related U.S. Application Data

(62) Division of application No. 11/633,948, filed on Dec. 5, 2006, now Pat. No. 7,642,606.

(30) Foreign Application Priority Data

Apr. 10, 2006 (KR) ................. 10-2006-0032448

(51) Int. Cl.
*H01L 29/792* (2006.01)
(52) U.S. Cl. .. 257/326; 257/315; 257/316; 257/E29.309
(58) Field of Classification Search .............. 257/315, 257/316, 326, E29.309
See application file for complete search history.

(56) References Cited

U.S. PATENT DOCUMENTS

| | | |
|---|---|---|
| 5,943,262 A | 8/1999 | Choi |
| 6,376,876 B1 | 4/2002 | Shin et al. |
| 6,469,935 B2 | 10/2002 | Hayashi |
| 6,477,088 B2 | 11/2002 | Ogura et al. |
| 6,593,188 B2 | 7/2003 | Cho |
| 6,741,502 B1 | 5/2004 | Cernea |
| 6,845,033 B2 | 1/2005 | Kirihata et al. |
| 6,885,044 B2 | 4/2005 | Ding |

(Continued)

FOREIGN PATENT DOCUMENTS

| | | |
|---|---|---|
| JP | 11204763 | 7/1999 |
| JP | 2004274046 | 9/2004 |
| KR | 100295150 | 4/2001 |
| KR | 20010075735 A | 8/2001 |

(Continued)

OTHER PUBLICATIONS

"Semiconductor Device Having Non-Volatile Memory and Method of Fabricating the Same" Specification, Drawings, and Prosecution History of U.S. Appl. No. 11/633,948, filed Dec. 5, 2006, by Sung-Chul Park, which is stored in the United States Patent and Trademark Office (USPTO) Image File Wrapper (IFW) system.

*Primary Examiner* — Long Pham
(74) *Attorney, Agent, or Firm* — Onello & Mello, LLP

(57) ABSTRACT

A memory cell of a non-volatile memory device, comprises: a select transistor gate of a select transistor on a substrate, the select transistor gate comprising: a gate dielectric pattern; and a select gate on the gate dielectric pattern; first and second memory cell transistor gates of first and second memory cell transistors on the substrate at opposite sides of the select transistor, each of the first and second memory cell transistor gates comprising: a tunnel insulating layer pattern; a charge storage layer pattern on the tunnel insulating layer pattern; a blocking insulating layer pattern on the charge storage layer pattern; and a control gate on the blocking insulating layer pattern; first and second floating junction regions in the substrate between the select transistor gate and the first and second memory cell transistor gates respectively; and first and second drain regions in the substrate at sides of the first and second memory cell transistor gates respectively opposite the first and second floating junction regions respectively. Methods of formation thereof are also provided.

20 Claims, 11 Drawing Sheets

U.S. PATENT DOCUMENTS

| | | |
|---|---|---|
| 6,916,708 B2 | 7/2005 | Tao et al. |
| 7,053,438 B2 | 5/2006 | Ding |
| 7,304,343 B2 | 12/2007 | Masuoka et al. |
| 2002/0008993 A1 | 1/2002 | Hayashi |
| 2002/0123194 A1 | 9/2002 | Cho |
| 2005/0085029 A1 | 4/2005 | Ding |
| 2005/0124115 A1 | 6/2005 | Tao et al. |
| 2005/0219910 A1 | 10/2005 | Cernea |
| 2005/0224847 A1 | 10/2005 | Masuoka et al. |

FOREIGN PATENT DOCUMENTS

| | | |
|---|---|---|
| KR | 20020071162 A | 9/2002 |
| KR | 20030001096 A | 1/2003 |
| KR | 20030030055 A | 4/2003 |
| KR | 100485502 | 3/2004 |
| KR | 1020040025245 | 3/2004 |
| KR | 1020040079840 | 9/2004 |
| TW | 251860 | 3/2006 |
| TW | 252488 | 4/2006 |
| TW | 252588 | 4/2006 |

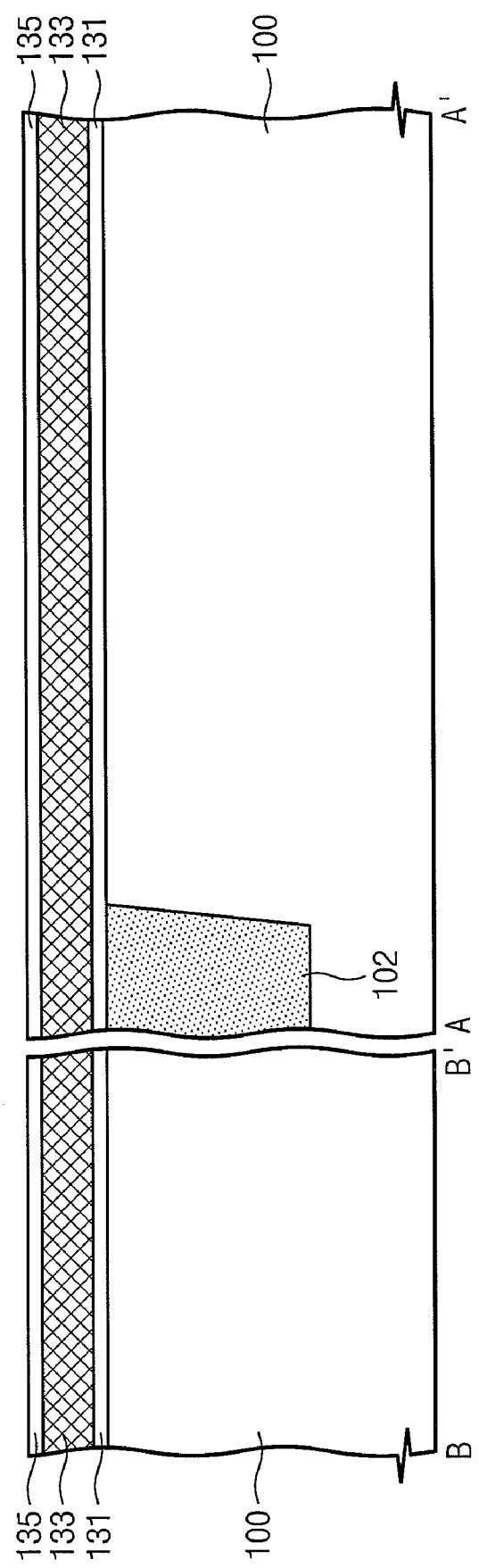

SEMICONDUCTOR DEVICE HAVING NON-VOLATILE MEMORY AND METHOD OF FABRICATING THE SAME

RELATED APPLICATIONS

This application is a divisional application of U.S. patent application Ser. No. 11/633,948, filed on Dec. 5, 2006, which claims the benefit of Korean patent application number 10-2006-0032448, filed on Apr. 10, 2006, in the Korean Intellectual Property Office, the contents of which applications are incorporated herein in their entirety by reference.

BACKGROUND OF THE INVENTION

Non-volatile semiconductor memory devices enjoy widespread use in a variety of applications. In particular, non-volatile devices are especially applicable to portable devices, since such devices are designed to retain data in situations where power is not always available or is frequently interrupted, or where low power usage is required. Such devices include mobile telecommunication systems, memory cards, digital cameras, camcorders, printers, scanners, music players, and the like.

A conventional non-volatile memory device includes an array of individually addressable memory cells at which data can be written to and read from. Reference is made to FIGS. 1A, 1B and 1C, which are a plan view, a cutaway side view taken along section line I-I' of FIG. 1A, and a circuit diagram, respectively, of a memory cell of a conventional non-volatile memory device.

Referring to FIGS. 1A and 1B, isolation structures 13, for example shallow trench isolation (STI) structures, are formed in a semiconductor substrate 11, defining active regions therebetween at which memory cells can be formed. Referring to FIG. 1C, each memory cell includes two transistors; namely a select transistor ST and a memory transistor MT. A bit line BL extends in a row direction, and a word line WL and sense line SL, extend in a column direction, perpendicular to the row direction. The select transistor ST comprises a select gate 27 that is spaced apart from the upper surface of the substrate 11 by a gate oxide pattern 17. Select gates 27 of memory cells of a common column of the memory cell array are connected by a word line WL. The memory transistor MT comprises a floating gate 21 that is spaced apart from the upper surface of the substrate 11 by a tunnel oxide pattern 15. A control gate 25 is formed on the floating gate 21, spaced apart from the floating gate 21 by a blocking oxide pattern 23. Control gates 25 of memory cells of a common column of the memory cell array are connected by a sense line SL. A source region 12s, a floating junction region 12f, and a drain region 12d are formed in upper surface regions of the substrate 11, by doping the substrate 11 with impurities. An insulation layer 37 is formed on the resulting structure and a bit line BL is provided on the insulation layer 37 to extend in a row direction between neighboring memory cells of a common row of the memory cell array. The bit line BL is connected to the drain regions 12d of the memory cells of a common row by a conductive inter-layer via 31 that extends vertically through the insulation layer 37.

The operation of the memory cell illustrated in FIGS. 1A-1C is well characterized in the field. A program operation is performed by connecting a high voltage to the sense line to cause electrons to be stored in the floating gate 21. The programming of the floating gate 21 is determined according to the status of the bit line BL. A read operation is performed by applying a Vcc voltage to the word line WL and the sense line SL. The resulting potential that is applied to the bit line BL determines whether charge is stored at the floating gate 21, and therefore determines the level of the data applied to the bit line BL. The program and erase operations depend on the well-characterized Fouler-Nodheim (FN) tunneling phenomenon. A FN-tunneling based device generally has superior performance over non-volatile devices that rely on the hot carrier injection phenomenon, since FN devices operate at lower currents, and therefore are better suited for portable devices.

With the continuing trend toward higher integration in semiconductor devices, there is a limit in the amount to which a memory cell can be reduced in size while ensuring effective operation. In the present device, such limitations are present in the feature sizes of the devices, for example, in the gate lengths of the select and memory transistors. Accordingly, further integration of such devices is becoming increasingly difficult as feature sizes approach the atomic scale, and as advances in conventional photolithographic fabrication techniques are less frequent at such reduced feature sizes.

SUMMARY OF THE INVENTION

Embodiments of the present invention are directed to a semiconductor device including a non-volatile memory device, a memory system, and a method of fabricating the same. In particular, embodiments of the present invention are directed to a non-volatile memory device, a memory system, and a method of fabricating the same in which two memory transistors of a memory cell unit share a common select transistor. In this manner, a memory cell of the non-volatile memory device in accordance with the embodiments of the present invention can be considered to consist of 1.5 transistors; namely one of the two memory transistors (one transistor), and the shared common select transistor (one-half transistor). In other words, three transistors are used to provide 2 memory cells. This leads to increased integration of the memory cell unit, and as a result, increased integration of the overall non-volatile memory device.

In a first aspect, the present invention is directed to a memory cell of a non-volatile memory device, comprising: a select transistor gate of a select transistor on a substrate, the select transistor gate comprising: a gate dielectric pattern; and a select gate on the gate dielectric pattern; first and second memory cell transistor gates of first and second memory cell transistors on the substrate at opposite sides of the select transistor, each of the first and second memory cell transistor gates comprising: a tunnel insulating layer pattern; a charge storage layer pattern on the tunnel insulating layer pattern; a blocking insulating layer pattern on the charge storage layer pattern; and a control gate on the blocking insulating layer pattern; first and second floating junction regions in the substrate between the select transistor gate and the first and second memory cell transistor gates respectively; and first and second drain regions in the substrate at sides of the first and second memory cell transistor gates respectively opposite the first and second floating junction regions respectively.

In one embodiment, the memory cell further comprises: an insulating layer on the substrate, on the first and second memory cell transistor gates, and on the select transistor gate; first and second contacts extending through the insulating layer contacting the first and second drain regions respectively; and a bit line on the insulating layer coupled between the first and second contacts.

In another embodiment, the select gate of the select transistor gate comprises a select line of the non-volatile memory device.

In another embodiment, a region of the substrate under the select transistor gate comprises a channel region of the select transistor and wherein the channel region is coupled to a common source line of the non-volatile memory device.

In another embodiment, the control gates of the first and second memory cell transistors comprise first and second word lines of the non-volatile memory device.

In another embodiment, the gate dielectric pattern of the select transistor gate and the tunnel insulating pattern of the first and second memory cell transistors are formed from a common, patterned, insulating layer.

In another embodiment, the insulating layer comprises a material selected from the group consisting of: oxide ($SiO_x$), nitride ($Si_xN_y$), carbide ($Si_xC_y$), $Si_xO_yN_z$, $Si_xO_yC_z$, $Al_xO_y$, $Hf_xO_y$, $Ta_xO_y$, other high-k dielectric materials, and combinations thereof.

In another embodiment, the select gate of the select transistor and the charge storage layer patterns of the first and second memory cell transistors are formed from a common, patterned, material layer.

In another embodiment, the material layer comprises a material selected from the group consisting of: doped polysilicon, a nanocrystalline conductor material and a charge trapping layer, wherein the charge trapping layer comprises a material selected from the group consisting of $Si_xN_y$, $Al_2O_3$, $HfAlO_x$, HfAlON, $HfSiO_x$, HfSiON and layered combinations thereof.

In another embodiment, the blocking insulating layer patterns of the first and second memory cell transistors comprise a material selected from the group consisting of: $SiO_x/Si_xN_y/SiO_x$ (ONO), $SiO_x$, $Si_xN_y$, $Al_2O_3$, $HfAlO_x$, HfAlON, $HfSiO_x$, HfSiON, and layered combinations thereof.

In another embodiment, the control gates of the first and second memory cell transistors comprise a material selected from the group consisting of: polysilicon, polysilicon including metal silicide, metal silicide, metal nitride, and combinations thereof.

In another aspect, the present invention is directed to a non-volatile memory device comprising: an array of memory cells arranged in rows and columns on a substrate; a plurality of select transistors each extending in a column direction, each select transistor comprising: a common source line in the substrate, the common source line extending in the column direction across a plurality of rows of the memory cells; a gate dielectric line pattern on the common source line; and a select line on the gate dielectric line pattern, the select line extending in the column direction; a plurality of first and second word lines extending in the column direction; each pair of first and second word lines at opposite sides of, and spaced apart from, a corresponding one of the select transistors; wherein each memory cell comprises: first and second memory cell transistors on the substrate at opposite sides of one of the select transistors, each of the first and second memory cell transistors comprising: a tunnel insulating layer pattern; a charge storage layer pattern on the tunnel insulating layer pattern; a blocking insulating layer pattern on the charge storage layer pattern; and a control gate on the blocking insulating layer pattern, the control gate of the first memory cell transistor being coupled to the first word line and the control gate of the second memory cell transistor being coupled to the second word line; first and second floating junction regions in the substrate between the select transistor and the first and second memory cell transistors respectively; and first and second drain regions in the substrate at sides of the first and second memory cell transistors respectively opposite the first and second floating junction regions respectively; and a plurality of bit lines extending in a row direction, each bit line being coupled to the first and second drain regions of the memory cells of a common row.

In one embodiment, the memory device further comprises: an insulating layer on the substrate, on the first and second memory cell transistors of the memory cells, and on the plurality of select transistors; and a plurality of first and second contacts extending through the insulating layer contacting the first and second drain regions respectively of the memory cells, wherein the plurality of bit lines are formed on the insulating layer.

In another embodiment, the memory device further comprises isolation regions in the substrate that isolate memory cells of neighboring rows.

In another embodiment, the first and second memory cell transistors of a memory cell are individually programmed by: applying a program voltage to one of the first and second word lines corresponding to the one of the first and second memory cells to be programmed; applying a zero voltage to the other of the first and second word lines corresponding to the other of the first and second memory cells; applying a zero voltage to the select line of the select transistor corresponding to the memory cell of the one of the first and second memory cells to be programmed; applying a ground voltage to the one of the plurality of bit lines coupled to the drain regions of the first and second memory cells; applying a ground voltage to the common source line; and applying a ground voltage to the substrate.

In another embodiment, the first and second memory cell transistors of a memory cell are individually erased by: applying an erase voltage to one of the first and second word lines corresponding to the one of the first and second memory cells to be erased; applying a zero voltage to the other of the first and second word lines corresponding to the other of the first and second memory cells; applying a zero voltage to the select line of the select transistor corresponding to the memory cell of the one of the first and second memory cells to be erased; applying a floating voltage to the one of the plurality of bit lines coupled to the drain regions of the first and second memory cells; applying a ground voltage to the common source line; and applying a ground voltage to the substrate.

In another embodiment, the first and second memory cell transistors of a memory cell are individually read by: applying a reading voltage to one of the first and second word lines corresponding to the one of the first and second memory cells to be read; applying a blocking voltage to the other of the first and second word lines corresponding to the other of the first and second memory cells; applying the reading voltage or a voltage greater than the reading voltage to the select line of the select transistor corresponding to the memory cell of the one of the first and second memory cells to be read; applying a voltage less than the reading voltage to the one of the plurality of bit lines coupled to the drain regions of the first and second memory cells; applying a ground voltage to the common source line; and applying a ground voltage to the substrate.

In another embodiment, the blocking voltage comprises a zero voltage. In another embodiment, the blocking voltage comprises a voltage less than the zero voltage. In another embodiment, the voltage less than the reading voltage applied to the one of the plurality of bit lines coupled to the drain regions of the first and second memory cells comprises approximately 0.5 volts.

In another aspect, the present invention is directed to a non-volatile memory system comprising: a memory controller that is arranged to connect to a data bus at which data signals are transferred; and a memory connected to the memory controller that stores and retrieves the data signals, wherein the memory comprises a non-volatile memory device comprising: an array of memory cells arranged in rows and columns on a substrate; a plurality of select transistors extending in a column direction, each select transistor comprising: a common source line in the substrate, the common source line extending in the column direction across a plurality of rows of the memory cells; a gate dielectric line pattern on the common source line; and a select gate line on the gate dielectric line pattern, the select gate line extending in the column direction; a plurality of first and second word lines extending in the column direction; each pair of first and second word lines at opposite sides of, and spaced apart from, a corresponding one of the select transistors; wherein each memory cell comprises: first and second memory cell transistor gates on the substrate at opposite sides of one of the select transistors, each of the first and second memory cell transistor gates comprising: a tunnel insulating layer pattern; a charge storage layer pattern on the tunnel insulating layer pattern; a blocking insulating layer pattern on the charge storage layer pattern; and a control gate on the blocking insulating layer pattern, the control gate of the first memory cell transistor being coupled to the first word line and the control gate of the second memory cell transistor being coupled to the second word line; first and second floating junction regions in the substrate between the select transistor and the first and second memory cell transistor gates respectively; and first and second drain regions in the substrate at sides of the first and second memory cell transistor gates respectively opposite the first and second floating junction regions respectively; and a plurality of bit lines extending in a row direction, each bit line being coupled to the first and second drain regions of the memory cells of a common row.

In one embodiment, the non-volatile memory system further comprises a processor coupled to the data bus for processing the data signals.

In another embodiment, the non-volatile memory system further comprises: an insulating layer on the substrate, on the first and second memory cell transistor gates of the memory cells, and on the plurality of select transistors; and a plurality of first and second contacts extending through the insulating layer contacting the first and second drain regions respectively of the memory cells, wherein the plurality of bit lines are formed on the insulating layer.

In another embodiment, the non-volatile memory system further comprises isolation regions in the substrate that isolate memory cells of neighboring rows.

In another embodiment, the first and second memory cell transistors of a memory cell are individually programmed by: applying a program voltage to one of the first and second word lines corresponding to the one of the first and second memory cells to be programmed; applying a zero voltage to the other of the first and second word lines corresponding to the other of the first and second memory cells; applying a zero voltage to the select line of the select transistor corresponding to the memory cell of the one of the first and second memory cells to be programmed; applying a ground voltage to the one of the plurality of bit lines coupled to the drain regions of the first and second memory cells; applying a ground voltage to the common source line; and applying a ground voltage to the substrate.

In another embodiment, the first and second memory cell transistors of a memory cell are individually erased by: applying an erase voltage to one of the first and second word lines corresponding to the one of the first and second memory cells to be erased; applying a zero voltage to the other of the first and second word lines corresponding to the other of the first and second memory cells; applying a zero voltage to the select line of the select transistor corresponding to the memory cell of the one of the first and second memory cells to be erased; applying a floating voltage to the one of the plurality of bit lines coupled to the drain regions of the first and second memory cells; applying a ground voltage to the common source line; and applying a ground voltage to the substrate.

In another embodiment, the first and second memory cell transistors of a memory cell are individually read by: applying a reading voltage to one of the first and second word lines corresponding to the one of the first and second memory cells to be read; applying a blocking voltage to the other of the first and second word lines corresponding to the other of the first and second memory cells; applying the reading voltage or a voltage greater than the reading voltage to the select line of the select transistor corresponding to the memory cell of the one of the first and second memory cells to be read; applying a voltage less than the reading voltage to the one of the plurality of bit lines coupled to the drain regions of the first and second memory cells; applying a ground voltage to the common source line; and applying a ground voltage to the substrate.

In another embodiment, the blocking voltage comprises a zero voltage. In another embodiment, the blocking voltage comprises a voltage less than the zero voltage. In another embodiment, the voltage less than the reading voltage applied to the one of the plurality of bit lines coupled to the drain regions of the first and second memory cells comprises approximately 0.5 volts.

In another aspect, the present invention is directed to a method of forming memory cell of a non-volatile memory device, comprising: providing a select transistor gate of a select transistor on a substrate, the select transistor gate comprising: a gate dielectric pattern; and a select gate on the gate dielectric pattern; providing first and second memory cell transistor gates of first and second memory cell transistors on the substrate at opposite sides of the select transistor, each of the first and second memory cell transistor gates comprising: a tunnel insulating layer pattern; a charge storage layer pattern on the tunnel insulating layer pattern; a blocking insulating layer pattern on the charge storage layer pattern; and a control gate on the blocking insulating layer pattern; providing first and second floating junction regions in the substrate between the select transistor gate and the first and second memory cell transistor gates respectively; and providing first and second drain regions in the substrate at sides of the first and second memory cell transistor gates respectively opposite the first and second floating junction regions respectively.

In one embodiment, the method further comprises: providing a dielectric layer on the substrate, on the first and second memory cell transistor gates, and on the select transistor gate; providing first and second contacts extending through the dielectric layer contacting the first and second drain regions respectively; and providing a bit line on the dielectric layer coupled between the first and second contacts.

In another embodiment, the select gate of the select transistor gate comprises a select line of the non-volatile memory device.

In another embodiment, a region of the substrate under the select transistor gate comprises a channel region of the select transistor and wherein the channel region is coupled to a common line of the non-volatile memory device.

In another embodiment, the control gates of the first and second memory cell transistor gates comprise first and second word lines of the non-volatile memory device.

In another embodiment, the gate dielectric pattern of the select transistor gate and the tunnel insulating pattern of the first and second memory cell transistors are formed from a common, patterned, insulating layer.

In another embodiment, the insulating layer comprises a material selected from the group consisting of: oxide ($SiO_x$), nitride ($Si_xN_y$), carbide ($Si_xC_y$), $Si_xO_yN_z$, $Si_xO_yC_z$, $Al_xO_y$, $Hf_xO_y$, $Ta_xO_y$, other high-k dielectric materials, and combinations thereof.

In another embodiment, the select gate of the select transistor and the charge storage layer patterns of the first and second memory cell transistors are formed from a common, patterned, material layer.

In another embodiment, the material layer comprises a material selected from the group consisting of: doped polysilicon, a nanocrystalline conductor material and a charge trapping layer, wherein the charge trapping layer comprises a material selected from the group consisting of $Si_xN_y$, $Al_2O_3$, $HfAlO_x$, HfAlON, $HfSiO_x$, HfSiON and layered combinations thereof.

In another embodiment, the blocking insulating layer patterns of the first and second memory cell transistors comprise a material selected from the group consisting of: $SiO_x/Si_xN_y/SiO_x$ (ONO), $SiO_x$, $Si_xN_y$, $Al_2O_3$, $HfAlO_x$, HfAlON, $HfSiO_x$, HfSiON, and layered combinations thereof.

In another embodiment, the control gates of the first and second memory cell transistors comprise a material selected from the group consisting of: polysilicon, polysilicon including metal silicide, metal silicide, metal nitride, and combinations thereof.

In another aspect, the present invention is directed to a method of forming a non-volatile memory device comprising: arranging an array of memory cells in rows and columns on a substrate; providing a plurality of select transistors each extending in a column direction, each select transistor comprising: a common source line in the substrate, the common source line extending in the column direction across a plurality of rows of the memory cells; a gate dielectric line pattern on the common source line; and a select line on the gate dielectric line pattern, the select line extending in the column direction; providing a plurality of first and second word lines extending in the column direction; each pair of first and second word lines at opposite sides of, and spaced apart from, a corresponding one of the select transistors; wherein each memory cell comprises: first and second memory cell transistors on the substrate at opposite sides of one of the select transistors, each of the first and second memory cell transistors comprising: a tunnel insulating layer pattern; a charge storage layer pattern on the tunnel insulating layer pattern; a blocking insulating layer pattern on the charge storage layer pattern; and a control gate on the blocking insulating layer pattern, the control gate of the first memory cell transistor being coupled to the first word line and the control gate of the second memory cell transistor being coupled to the second word line; first and second floating junction regions in the substrate between the select transistor and the first and second memory cell transistors respectively; and first and second drain regions in the substrate at sides of the first and second memory cell transistors respectively opposite the first and second floating junction regions respectively; and providing a plurality of bit lines extending in a row direction, each bit line being coupled to the first and second drain regions of the memory cells of a common row.

In one embodiment, the method further comprises: providing an insulating layer on the substrate, on the first and second memory cell transistors of the memory cells, and on the plurality of select transistors; and providing a plurality of first and second contacts extending through the insulating layer contacting the first and second drain regions respectively of the memory cells, wherein the plurality of bit lines are formed on the insulating layer.

In another embodiment, the method further comprises forming isolation regions in the substrate that isolate memory cells of neighboring rows.

In another embodiment, the first and second memory cell transistors of a memory cell are individually programmed by: applying a program voltage to one of the first and second word lines corresponding to the one of the first and second memory cells to be programmed; applying a zero voltage to the other of the first and second word lines corresponding to the other of the first and second memory cells; applying a zero voltage to the select line of the select transistor corresponding to the memory cell of the one of the first and second memory cells to be programmed; applying a ground voltage to the one of the plurality of bit lines coupled to the drain regions of the first and second memory cells; applying a ground voltage to the common source line; and applying a ground voltage to the substrate.

In another embodiment, the first and second memory cell transistors of a memory cell are individually erased by: applying an erase voltage to one of the first and second word lines corresponding to the one of the first and second memory cells to be erased; applying a zero voltage to the other of the first and second word lines corresponding to the other of the first and second memory cells; applying a zero voltage to the select line of the select transistor corresponding to the memory cell of the one of the first and second memory cells to be erased; applying a floating voltage to the one of the plurality of bit lines coupled to the drain regions of the first and second memory cells; applying a ground voltage to the common source line; and applying a ground voltage to the substrate.

In another embodiment, the first and second memory cell transistors of a memory cell are individually read by: applying a reading voltage to one of the first and second word lines corresponding to the one of the first and second memory cells to be read; applying a blocking voltage to the other of the first and second word lines corresponding to the other of the first and second memory cells; applying the reading voltage or a voltage greater than the reading voltage to the select line of the select transistor corresponding to the memory cell of the one of the first and second memory cells to be read; applying a voltage less than the reading voltage to the one of the plurality of bit lines coupled to the drain regions of the first and second memory cells; applying a ground voltage to the common source line; and applying a ground voltage to the substrate.

In another embodiment, the blocking voltage comprises a zero voltage. In another embodiment, the blocking voltage comprises a voltage less than the zero voltage. In another embodiment, the voltage less than the reading voltage applied to the one of the plurality of bit lines coupled to the drain regions of the first and second memory cells comprises approximately 0.5 volts.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 4B through 7 are cutaway side views taken along section lines A-A' and B-B' of FIG. 4A of a memory cell of a non-volatile memory device during fabrication of the memory cell, in accordance with an embodiment of the present invention.

DETAILED DESCRIPTION OF EMBODIMENTS OF THE INVENTION

Exemplary embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. may be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Figure 1A:
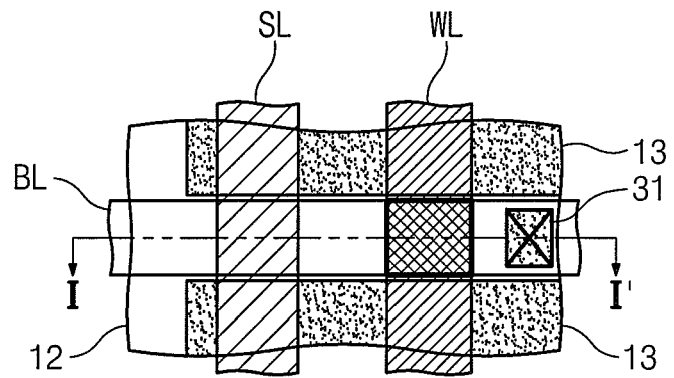
FIGS. 1A, 1B and 1C, are a plan view, a cutaway side view taken along section line I-I' of FIG. 1A, and a circuit diagram, respectively, of a memory cell of a conventional non-volatile memory device.
Figure 1B:
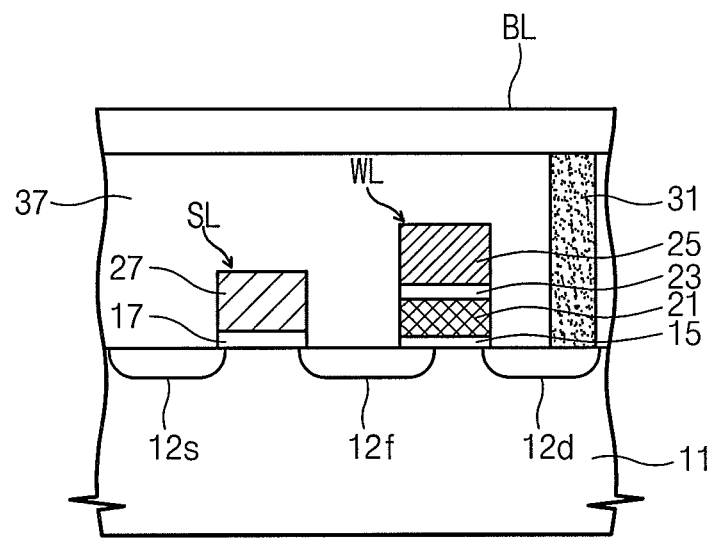
Figure 1C:
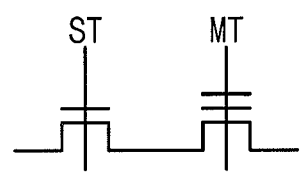
Figure 2A:
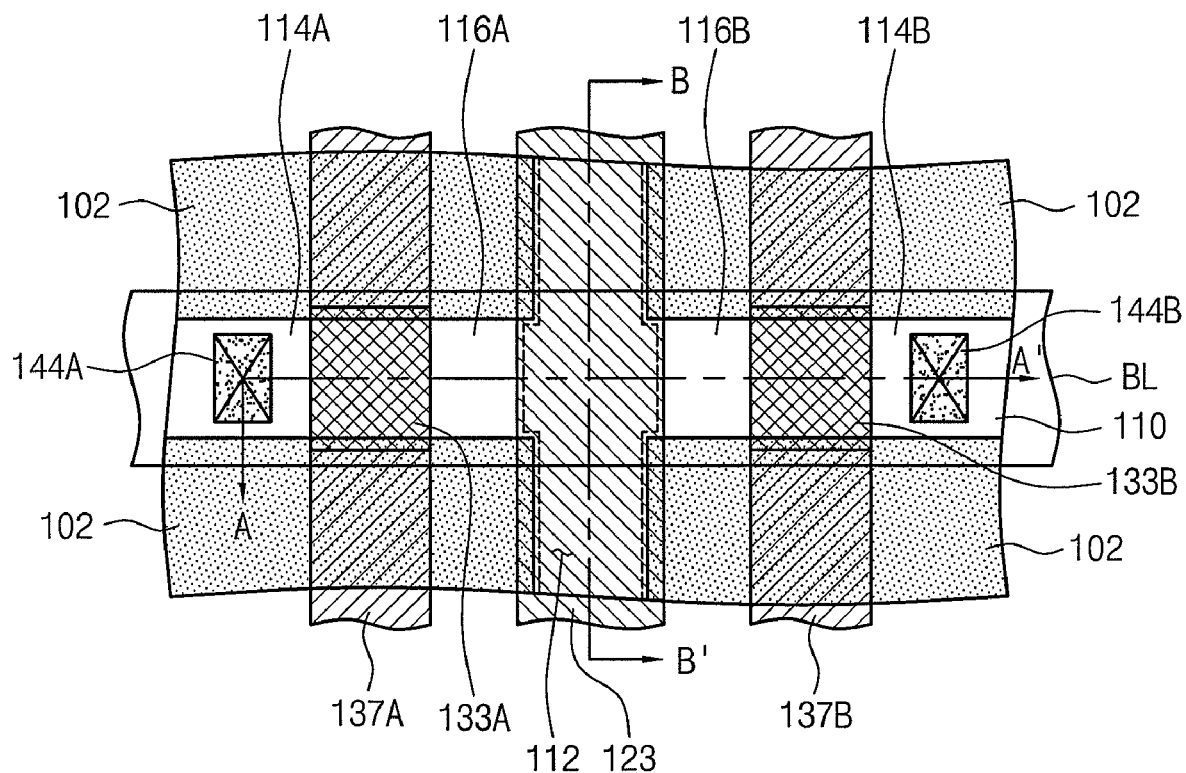
FIGS. 2A, 2B, and 2C are a plan view, cutaway side views taken along section lines A-A' and B-B' of FIG. 2A, and a circuit diagram, respectively, of a memory cell of a non-volatile memory device, in accordance with an embodiment of the present invention.
Figure 2B:
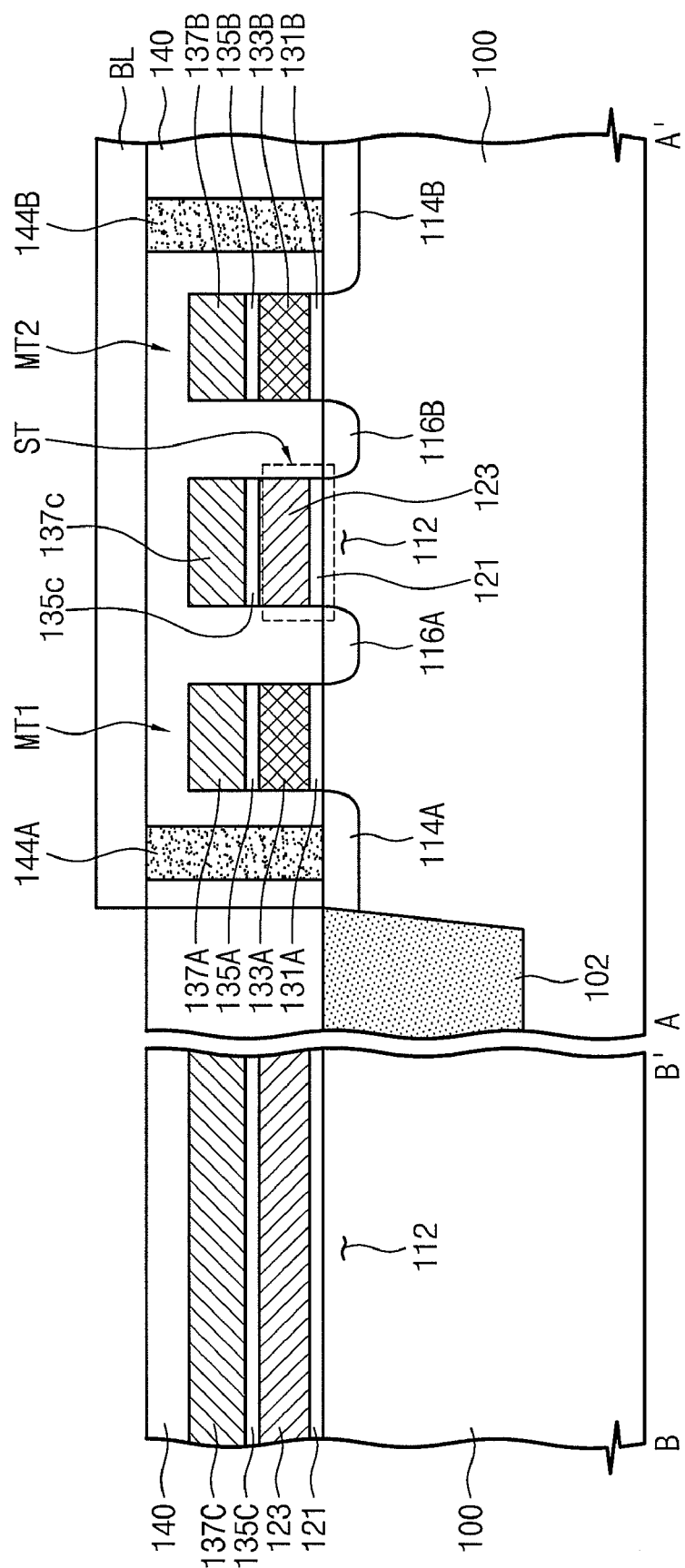
Figure 2C:
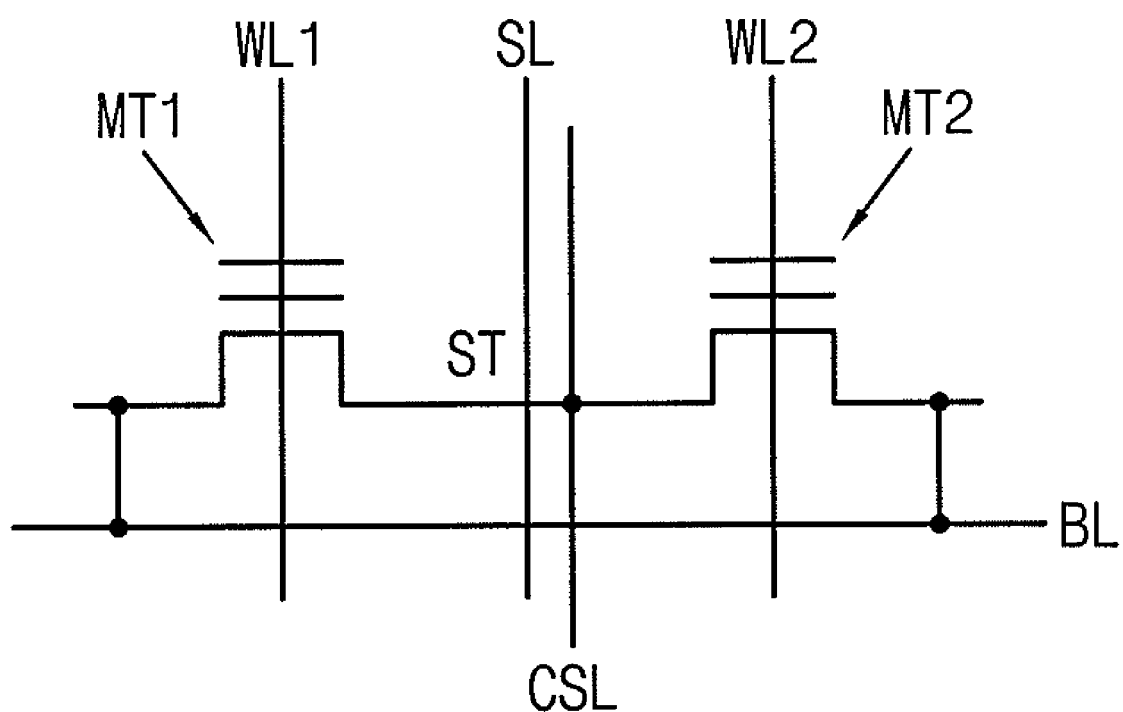

FIGS. 2A, 2B, and 2C are a plan view, cutaway side views taken along section lines A-A' and B-B' of FIG. 2A, and a circuit diagram, respectively, of a memory cell of a non-volatile memory device, in accordance with an embodiment of the present invention.

Referring to FIGS. 2A and 2B, isolation structures 102, for example shallow trench isolation (STI) structures, are formed in a semiconductor substrate 100, defining active regions therebetween at which memory cells can be formed. Referring to FIG. 2C, each memory cell unit MC comprises two memory cells that are formed by three transistors; namely first and second memory transistors MT and a shared select transistor ST. In this manner, each of the first and second memory cells of the memory cell unit MC can be considered to consist of 1.5 transistors; namely one of the first and second memory transistors MT1, MT2 (one transistor), and the shared common select transistor ST (one-half transistor). In other words, three transistors MT1, MT2, ST provide two individually addressable memory cells that comprise a memory cell unit MC that is capable of storing two bits of individually addressable and retrievable data.

In a memory cell unit MC, a bit line BL extends in a row direction, and first and second word lines WL1, WL2, a select line SL, and a common source line CSL 112 extend in the column direction, perpendicular to the row direction. The select transistor ST comprises a select gate 123 that is spaced apart from the upper surface of the substrate 100 by a gate oxide pattern 121. Select gates 123 of memory cell units of a common column of the memory cell array are connected by a select line SL that forms the select gates 123.

First and second memory transistors MT1, MT2 are formed at opposite sides of the select gate 123. Each of the first and second memory transistors MT1, MT2 comprises a floating gate 133A, 133B that is spaced apart from the upper surface of the substrate 100 by a tunnel oxide pattern 131A, 131B. First and second control gates 137A, 137B are formed on the respective first and second floating gates 133A, 133B, spaced apart from the first and second floating gates 133A, 133B by respective first and second blocking oxide patterns 135A, 135B. Control gates 137A of first memory transistors MT1 of memory cell units MC of a common column of the memory cell array are connected by a first word line WL1. Control gates 137B of second memory transistors of memory cell units MC of a common column of the memory cell array are connected by a second word line WL2.

A first floating junction region 116A is formed in an upper surface region of the substrate 100 between the select gate 123 of the select transistor ST and the first floating gate 133A of the first memory transistor MT1. A first drain region 114A is formed in an upper surface region of the substrate 100 adjacent the first floating gate 133A, opposite the first floating junction region 116A. A second floating junction region 116B is formed in an upper surface region of the substrate 100 between the select gate 123 of the select transistor ST and the second floating gate 133B of the second memory transistor MT2. A second drain region 114B is formed in an upper surface region of the substrate 100 adjacent the second floating gate 133B, opposite the second floating junction region 116B. An insulation layer 140 is formed on the resulting structure and a bit line BL is provided on the insulation layer 140 to extend in a row direction between neighboring first and second memory transistors MT1, MT2 of memory cell units MC of a common row of the memory cell array. The bit line BL is connected to the first and second drain regions 114A, 114B of the memory cell unit MC by conductive inter-layer vias 144A, 144B that extend vertically through the insulation layer 140.

The region of the substrate 110 between the first and second floating junction region serves as a common source line CSL 112 in the present embodiment. The common source line CSL 112, like the select line SL, extends in the column direction, between neighboring select transistors ST of memory cell units of a common row of the memory cell array.

A dummy blocking oxide pattern 135C and a dummy control gate pattern 137C are on the select gate 123 of the select transistor ST in this exemplary embodiment. The dummy blocking oxide pattern 135C and a dummy control gate pattern 137C in this example do not serve an operational purpose in the present embodiment, but remain after fabrication of the similarly patterned first and second blocking oxide patterns 135A, 135B and patterned first and second control gates 137A, 137B in order to reduce the number of manufacturing steps required for fabricating the device. In an alternative embodiment, the dummy blocking oxide pattern 135C and a dummy control gate pattern 137C can optionally be removed from the top of the select gate 123 in an additional fabrication step. The layout of the memory cell unit MC in which the first and second memory transistors MT1, MT2 share a select transistor ST formed on the common source line CSL make FN-tunneling-based programming possible.

Figure 3A:
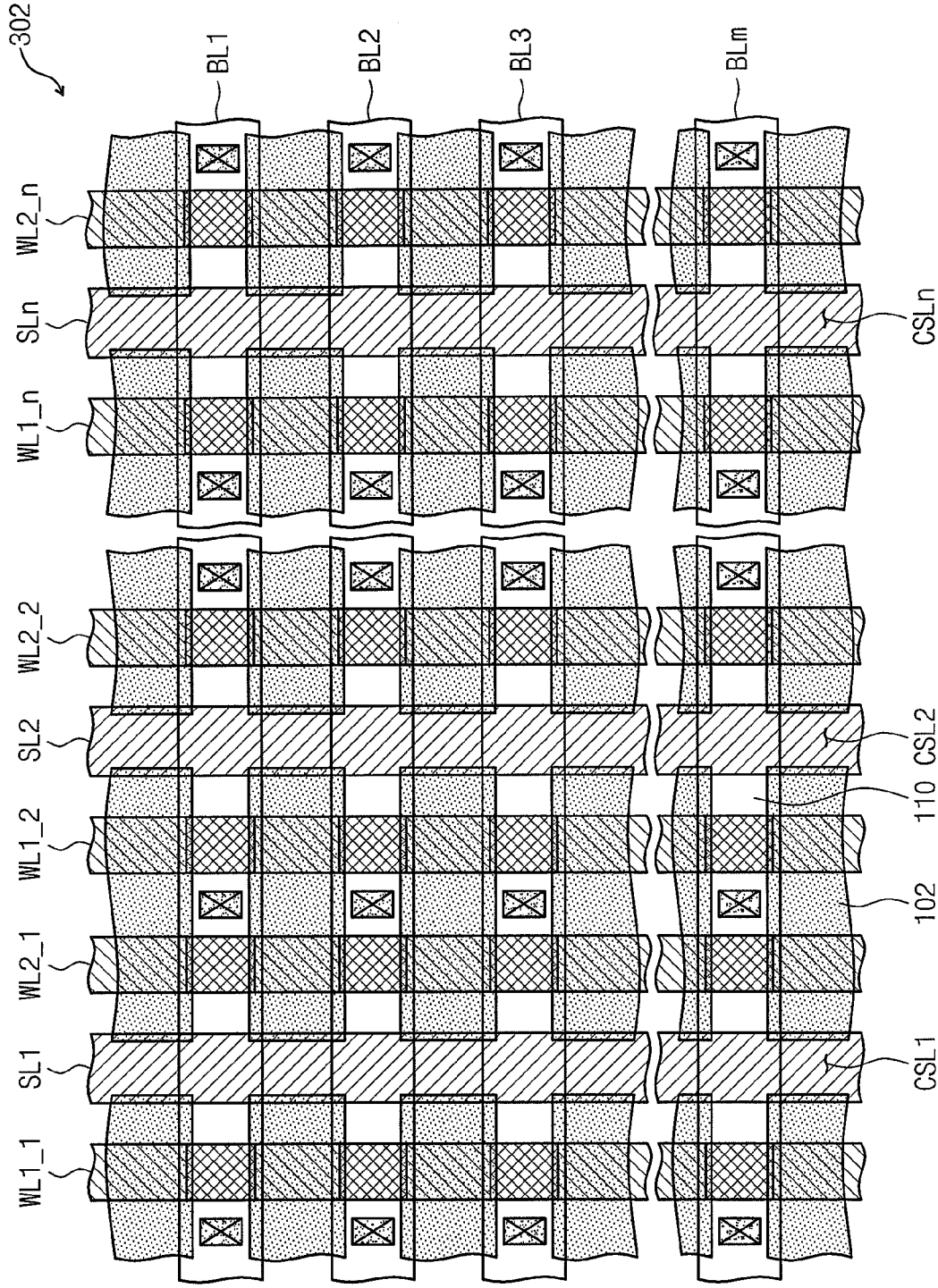
FIGS. 3A and 3B are a plan view and a circuit diagram respectively of a memory cell array of a non-volatile memory device, in accordance with an embodiment of the present invention.
Figure 3B:
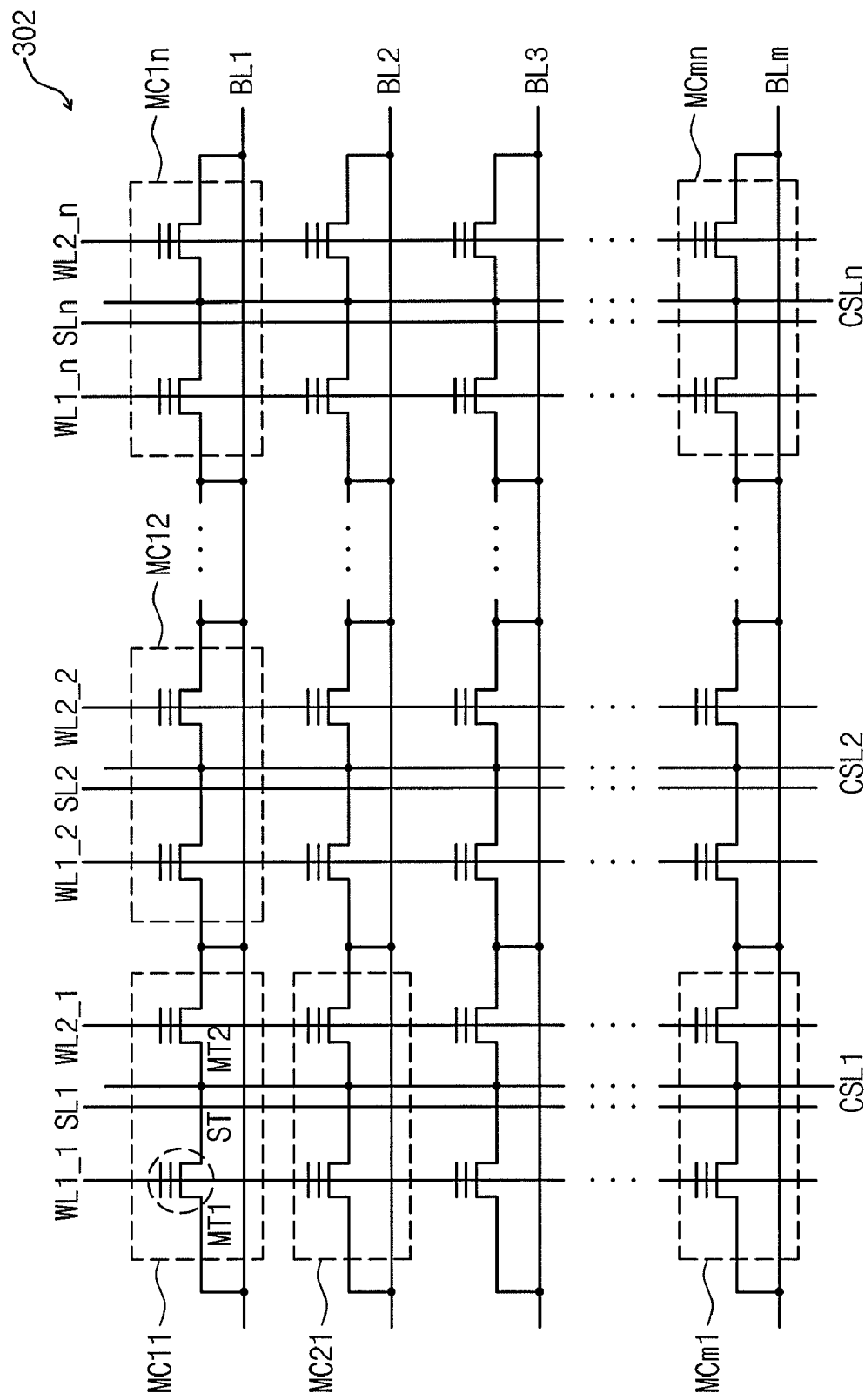

FIGS. 3A and 3B are a plan view and a circuit diagram respectively of a memory cell array of a non-volatile memory device, in accordance with an embodiment of the present invention. In the illustrations of FIGS. 3A and 3B it can be seen that the memory cell array 302 includes a plurality of memory cell units MCmn that extend in the row direction and in the column direction. In the row direction, the memory cell units each correspond to a common bit line BL1, BL2, . . . BLm. In the column direction, the memory cell units each correspond to a common source line CSL1, CS12, . . . , CSLn, a common select line SL1, SL2, . . . , SLn, a common first word line WL1_1, WL1_2 . . . WL1_n and a common second word line WL2_1, WL2_2 . . . WL2_n.

Program and erase operations of a cell MT1, MT2 of the memory cell unit MCmn of the memory cell array 302 of FIG. 3B will now be described with reference to the circuit diagram of FIG. 3B.

In a programming operation, assuming that the memory cell to be programmed is cell MT1 of memory cell unit MC11, the following voltages are applied to the first word line WL1_1, the second word line WL2_1, the select line SL_1, the bit line BL_1, the common source line CSL1 and the substrate, to place the cell MT1 of memory cell unit MC11 in a programming condition:

| Selected memory cell unit (MC11) | WL1_1 | WL2_1 | SL_1 | BL_1 | CSL1 | Substrate |
|---|---|---|---|---|---|---|
| Bias condition | Vpgm | 0 V | 0 V | ground | ground | ground |

For any unselected memory cells, the following voltages are applied (n≠1):

| Unselected memory cell unit | WL1_n | WL2_n | SL_n | BL_m | CSLn | Substrate |
|---|---|---|---|---|---|---|
| Bias condition | 0 V | 0 V | 0 V | Vcc or float | ground | ground | where the program voltage Vpgm is a voltage in a range of about 15 V to 20 V, and the Vcc voltage is a voltage in a range of about 1.8 V to 2.3 V.

Under these conditions, FN tunneling occurs through the tunnel oxide layer 15 of the cell MT1. This causes cell MT1 of the memory cell unit MC11 to have a first threshold voltage Vth1.

In an erase operation, assuming that the memory cell to be erased is cell MT1 of memory cell unit MC11, the following voltages are applied to the first word line WL1_1, the second word line WL2_1, the select line SL_1, the bit line BL_1, the common source line CSL1 and the substrate, to place the cell MT1 of memory cell unit MC11 in an erase condition:

| Selected memory cell unit (MC11) | WL1_1 | WL2_1 | SL_1 | BL_1 | CSL1 | Substrate |
|---|---|---|---|---|---|---|
| Bias condition | Vers | 0 V | 0 V | float | ground | ground |

For any unselected memory cells, the following voltages are applied (n≠1):

| Unselected memory cell unit | WL1_n | WL2_n | SL_n | BL_m | CSLn | Substrate |
|---|---|---|---|---|---|---|
| Bias condition | 0 V | 0 V | 0 V | float | ground | ground | where the erase voltage Vers is a voltage in a range of about −15 V to −20 V.

Under these conditions, any charge that is previously stored in the floating gate 133A of the first memory transistor MT1 is discharged into the substrate. As a result, any first memory transistors MT1 that operate in response to the first word line WL1_1 will have a second threshold voltage of Vth2 that is lower than the first threshold voltage Vth1

Read operations of a memory cell unit MCmn of the memory cell array 302 of FIG. 3B will now be described with reference to the circuit diagram of FIG. 3B. The read operation can occur under two operating conditions. In a first operating condition, both the first threshold voltage Vth1 and the second threshold voltage Vth2 are greater than 0 V. In a second operating condition, the first threshold voltage Vth1 is greater than 0 V and the second threshold voltage Vth2 is less than 0 V.

In a read operation under the first operating condition, assuming that the memory cell to be read is cell MT1 of memory cell unit MC11, the following voltages are applied to the first word line WL1_1, the second word line WL2_1, the select line SL_1, the bit line BL_1, the common source line CSL1 and the substrate, in order to place the cell MT1 of memory cell unit MC11 in a read condition:

| Selected memory cell unit (MC11) | WL1_1 | WL2_1 | SL_1 | BL_1 | CSL1 | Substrate |
|---|---|---|---|---|---|---|
| Bias condition | Vcc | 0 V | Vcc or greater | 0.5 V | ground | ground |

For any unselected memory cells, the following voltages are applied:

| Unselected memory cell unit | WL1_n | WL2_n | SL_n | BL_m | CSLn | Substrate |
|---|---|---|---|---|---|---|
| Bias condition | 0 V | 0 V | 0 V | float | ground | ground | where the Vcc voltage is in a range of about 1.8 V to 2.3 V.

Under these conditions, if the first memory transistor MT1 is in a programmed state, current will not flow through the corresponding bit line BL1. If the first memory transistor MT1 is in an erased state, current will flow through the corresponding bit line BL1. The read state of the binary data, "0" or "1", is determined according to the amount of current flowing through the bit line.

In a read operation under the second operating condition, assuming that the memory cell to be read is cell MT1 of memory cell unit MC11, the following voltages are applied to the first word line WL1_1, the second word line WL2_1, the select line SL_1, the bit line BL_1, the common source line CSL1 and the substrate, in order to place the cell MT1 of memory cell unit MC11 in a read condition:

| Selected memory cell unit (MC11) | WL1_1 | WL2_1 | SL_1 | BL_1 | CSL1 | Substrate |
|---|---|---|---|---|---|---|
| Bias condition | Vcc | Vblock | Vcc or greater | 0.5 V | ground | ground |

For any unselected memory cells, the following voltages are applied:

| Unselected memory cell unit | WL1_n | WL2_n | SL_n | BL_m | CSLn | Substrate |
|---|---|---|---|---|---|---|
| Bias condition | 0 V | 0 V | 0 V | float | ground | ground | where the Vcc voltage is in a range of about 1.8 V to 2.3 V, and where the voltage Vblock represents a blocking voltage in a range of about −1.8 V to −2.3 V. The Vblock voltage is preferably a negative voltage so as to prevent the second memory transistor MT2 of a memory cell unit MC from becoming activated at the same time as a first memory cell transistor MT1 of the memory cell unit MC. Application of the blocking voltage Vblock to the gate of the second memory cell transistor of the memory cell unit sharing the same, selected, select line SL, ensures that the second memory transistor MT2 is in an "off" state, at a time when the first memory transistor MT1 is being read.

Under these conditions, if the first memory transistor MT1 is in a programmed state, current will not flow through the corresponding bit line BL1. If the first memory transistor MT1 is in an erased state, current will flow through the corresponding bit line BL1. The read state of the binary data, "0" or "1", is determined according to the amount of current flowing through the bit line.

Figure 4A:
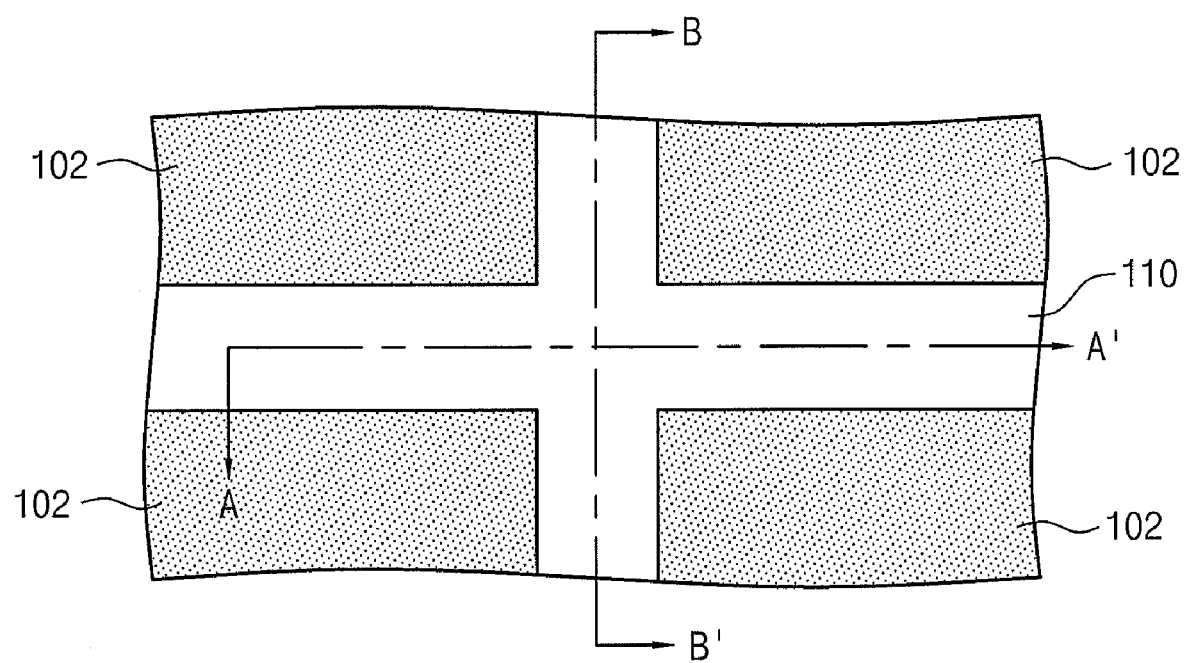
FIGS. 4A is a plan view of a memory cell of a non-volatile memory device, in accordance with an embodiment of the present invention.

FIGS. 4A is a plan view of a memory cell of a non-volatile memory device, in accordance with an embodiment of the present invention. FIGS. 4B through 7 are cutaway side views taken along section lines A-A' and B-B' of FIG. 4A of a memory cell of a non-volatile memory device during fabrication of the memory cell, in accordance with an embodiment of the present invention.

Figure 4B:
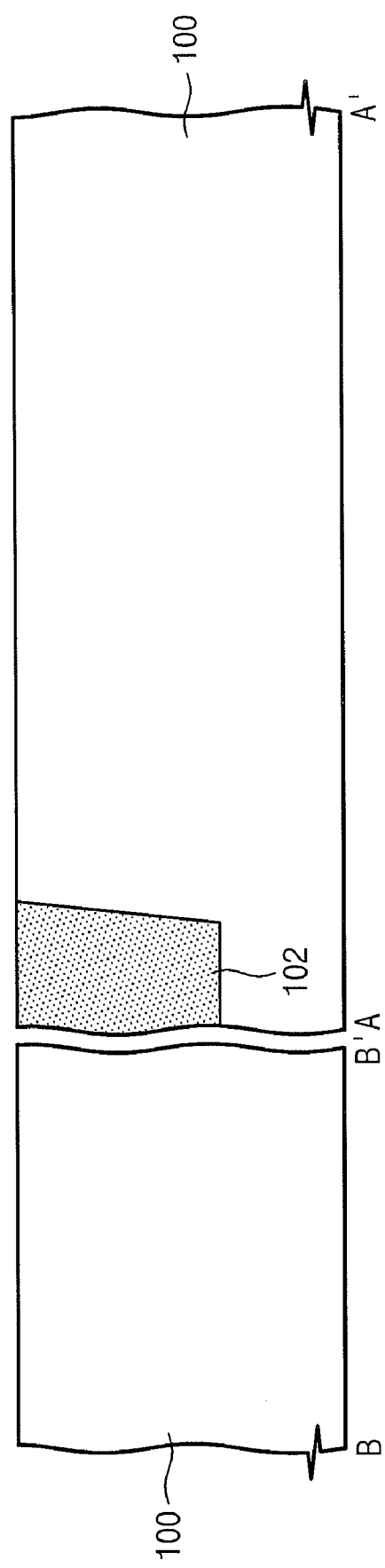
Figure 6:
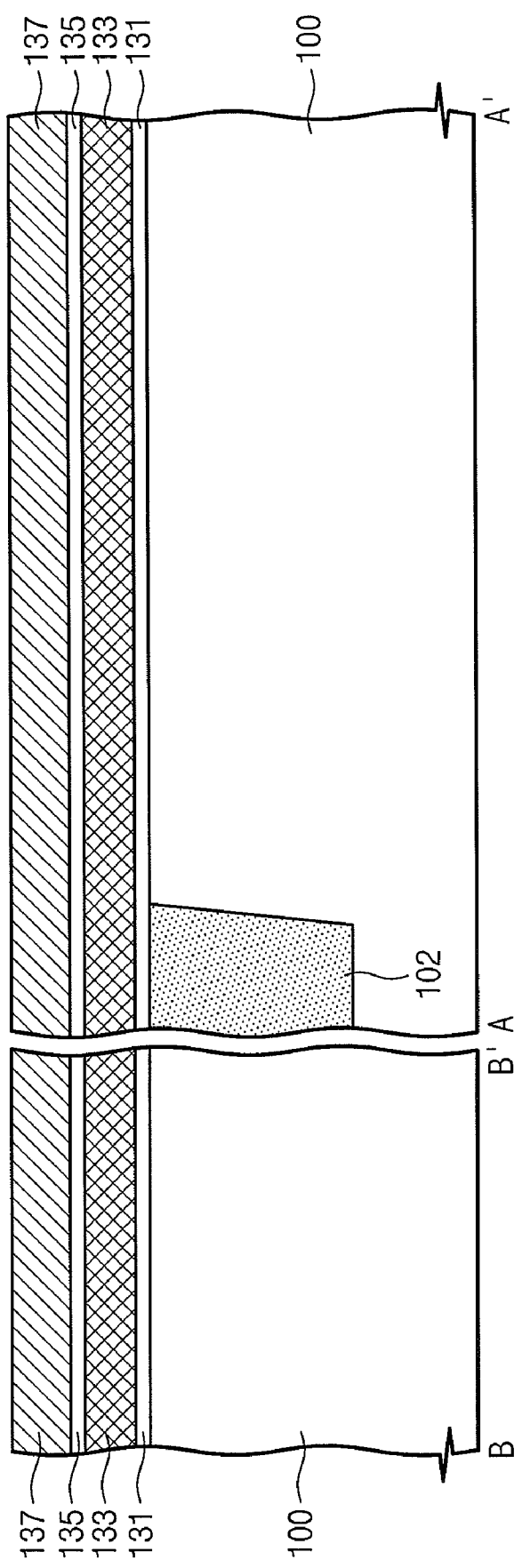

Referring to FIGS. 4A and 4B, isolation structures, for example shallow trench isolation (STI) structures 102 are formed in a substrate 100. As used herein, the term "substrate" refers to any of a number of substrate types, including, but not limited to, a bulk semiconductor substrate, a silicon-on-insulator (SOI) structure, or an epitaxial layer, for example a single-crystal layer, that is grown on a bulk substrate. The isolation structures 102 define active regions of the substrate 100 therebetween.

Referring to FIG. 5, an insulator layer 131 a charge storage layer 133 and a blocking insulator layer 135 are sequentially formed on the upper surface of the substrate. In one embodiment, the insulator layer 131 is formed to a thickness ranging from about 30 Å to about 350 Å and is formed of a material selected from oxide ($SiO_x$), nitride ($Si_xN_y$), carbide ($Si_xC_y$), $Si_xO_yN_z$, $Si_xO_yC_z$, $Al_xO_y$, $Hf_xO_y$, $Ta_xO_y$, other high-k dielectric materials, and a combination of these materials. In one embodiment, the charge storage layer 133 is formed of a material selected from doped polysilicon, a nanocrystalline conductor material wherein a conducting material is deposited or distributed in an insulating material as well known in the art, and a charge trapping layer. In a case where the charge trapping layer is used, the charge trapping layer can be formed of a material that is selected, for example, from $Si_xN_y$, $Al_2O_3$, $HfAlO_x$, HfAlON, $HfSiO_x$, HfSiON and multiple-layered combinations of these materials, and to a thickness of between about 30-3000 Å, for example. In various embodiments, the blocking insulator layer 135 is formed of a material selected from the group consisting of $SiO_x/Si_xN_y/SiO_x$ (ONO), $SiO_x$, $Si_xN_y$, $Al_2O_3$, $HfAlO_x$, HfAlON, $HfSiO_x$, HfSiON, and multiple-layered combinations of these materials, and to a thickness of between about 70-300 Å, for example Referring to FIG. 6, a conducting layer 137 is formed on the blocking insulator layer 135 to a thickness of between about 500-4000 Å, for example. The conducting layer can be formed of a material that is selected, for example, from polysilicon, polysilicon including metal silicide, metal silicide and metal nitride.

Figure 7:
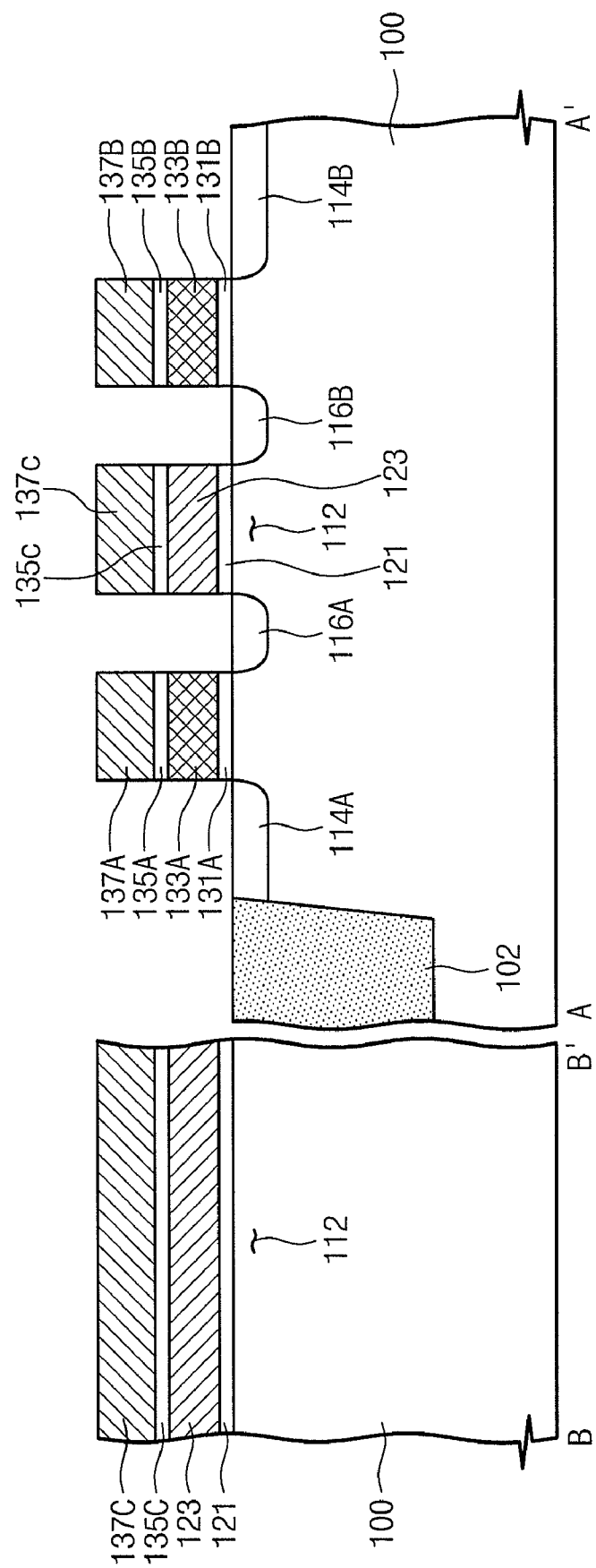

Referring to FIG. 7, the conducting layer 137, the blocking insulator layer 135, the charge storage layer 133, and the insulator layer 131 are patterned using well-known photolithography and etching processes to form patterned gate stacks. A first patterned gate stack includes a first patterned conducting layer 137A, a first patterned blocking oxide layer 135A, a first floating gate pattern 133A and a first tunnel oxide pattern 131A. A second patterned gate stack includes a second patterned conducting layer 137B, a second patterned blocking oxide layer 135B, a second floating gate pattern 133B and a second tunnel oxide pattern 131B. A third patterned gate stack includes a third patterned conducting layer 137C, a third patterned blocking oxide layer 135C, a third floating gate pattern 123 and a third tunnel oxide pattern 121. The third patterned gate stack is positioned between the first and the second patterned gate stacks in the row direction of the array.

Ion implantation is then performed using the first, second and third patterned gate stacks as an ion implantation mask to provide first and second floating junction regions 116A, 116B at opposite sides of the third patterned gate stack, and to provide the first and second drain regions 114A, 114B at sides of the first and second patterned gate stacks opposite the first and second floating junction regions 116A, 116B.

The first patterned conducting layer 137A of the first gate stack provides a control gate of the first memory transistor MT1. The first floating gate pattern 133A of the first gate stack provides a floating gate of the first memory transistor MT1. The second patterned conducting layer 137B of the second gate stack provides a control gate of the second memory transistor MT2. The second floating gate pattern 133B of the second gate stack provides a floating gate of the second memory transistor MT2. The third patterned conducting layer 137C of the third gate stack serves no function in the present device, and remains in the illustrated embodiment in order to simplify fabrication of the device. The third patterned conducting layer 137C and the underlying third patterned blocking oxide layer 135C can optionally be removed in a subsequent fabrication procedure. The third floating gate pattern 123 operates as a select gate of the select transistor ST of the memory cell unit.

Referring to the section line B-B' of FIG. 7, it can be seen that the third floating gate pattern 123, or select gate, extends in a column direction to connect neighboring select transistors ST in the column direction to thereby provide as a select line SL of the device. In a similar manner, the region of the substrate 100 below the select gate 123 extends in the column direction to connect neighboring select transistors ST in the column direction to thereby operate as a common source line CSL of the device. Also, the first patterned conducting layer 137A extends in a column direction to connect neighboring first memory transistors MT1 in the column direction to thereby operate as a first word line WL1, and the second patterned conducting layer 137B extends in a column direction to connect neighboring second memory transistors MT2 in the column direction to thereby operate as a second word line WL2.

Referring back to FIGS. 2A and 2B, an insulation layer 140 is formed on the resulting structure and via openings are formed to extend vertically through the insulation layer 140. The via openings are filled, for example with tungsten, to provide conductive inter-layer vias 144A, 144B. A bit line BL is provided on the insulation layer 140 to extend in the row direction between neighboring first and second memory transistors MT1, MT2 of memory cell units MC of a common row of the memory cell array. The bit line BL is connected to the first and second drain regions 114A, 114B of the memory cell unit MC by the conductive inter-layer vias 144A, 144B.

The non-volatile memory device described above can be readily applied to a memory system. For example, a memory system commonly includes a memory controller that is arranged to connect to a data bus at which data signals are transferred. A memory device, connected to the memory controller, stores and retrieves the data signals, for example, under the control of a processor that is also coupled to the data bus. The processor can control the transfer of data signals to and from the memory device via the memory controller, and further has processing capacity for processing the data signals. The memory device can comprise a non-volatile memory device of the type described above to achieve the various advantages discussed above. The processor, memory controller, and memory device can be co-located on a common integrate circuit, or can be fabricated on separate integrated circuits.

In this manner, a semiconductor device including non-volatile memory device, a method of fabricating the same, and a memory system, are provided. In particular, disclosed above are exemplary embodiments of a non-volatile memory device and a method of fabricating the same in which two memory transistors in a memory cell unit share a common select transistor. In this manner, a memory cell of the non-volatile memory device can be considered to consist of 1.5 transistors; namely one of the two memory transistors (one transistor), and the shared common select transistor (one-half transistor). In other words, three transistors are used to provide 2 memory cells. This leads to increased integration of the memory cell unit, and as a result, increased integration of the overall non-volatile memory device.

While this invention has been particularly shown and described with references to preferred embodiments thereof, it will be understood by those skilled in the art that various changes in form and details may be made herein without departing from the spirit and scope of the invention as defined by the appended claims.

While the foregoing has described what are considered to be the best mode and/or other preferred embodiments, it is understood that various modifications may be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A memory cell of a non-volatile memory device, comprising:
    a select transistor gate of a select transistor on a substrate, the select transistor gate comprising: a gate dielectric pattern; and a select gate on the gate dielectric pattern;
    first and second memory cell transistor gates of first and second memory cell transistors on the substrate at opposite sides of the select transistor, each of the first and second memory cell transistor gates comprising: a tunnel insulating layer pattern; a charge storage layer pattern on the tunnel insulating layer pattern; a blocking insulating layer pattern on the charge storage layer pattern; and a control gate on the blocking insulating layer pattern;
    first and second floating junction regions in the substrate between the select transistor gate and the first and second memory cell transistor gates respectively; and
    first and second drain regions in the substrate at sides of the first and second memory cell transistor gates respectively opposite the first and second floating junction regions respectively.

2. The memory cell of claim 1 further comprising:
    an insulating layer on the substrate, on the first and second memory cell transistor gates, and on the select transistor gate;
    first and second contacts extending through the insulating layer contacting the first and second drain regions respectively; and
    a bit line on the insulating layer coupled between the first and second contacts.

3. The memory cell of claim 1 wherein the select gate of the select transistor gate comprises a select line of the non-volatile memory device.

4. The memory cell of claim 1 wherein a region of the substrate under the select transistor gate comprises a channel region of the select transistor and wherein the channel region is coupled to a common source line of the non-volatile memory device.

5. The memory cell of claim 1 wherein the control gates of the first and second memory cell transistors comprise first and second word lines of the non-volatile memory device.

6. The memory cell of claim 1 wherein the gate dielectric pattern of the select transistor gate and the tunnel insulating pattern of the first and second memory cell transistors are formed from a common, patterned, insulating layer.

7. The memory cell of claim 6 wherein the insulating layer comprises a material selected from the group consisting of: oxide ($SiO_x$), nitride ($Si_xN_y$), carbide ($Si_xC_y$), $Si_xO_yN_z$, $Si_xO_yC_z$, $Al_xO_y$, $Hf_xO_y$, $Ta_xO_y$, other high-k dielectric materials, and combinations thereof.

8. The memory cell of claim 1 wherein the select gate of the select transistor and the charge storage layer patterns of the first and second memory cell transistors are formed from a common, patterned, material layer.

9. The memory cell of claim 8 wherein the material layer comprises a material selected from the group consisting of: doped polysilicon, a nanocrystalline conductor and a charge trapping layer, wherein the charge trapping layer comprises a material selected from the group consisting of $Si_xN_y$, $Al_2O_3$, $HfAlO_x$, HfAlON, $HfSiO_x$, HfSiON and layered combinations thereof.

10. The memory cell of claim 1 wherein the blocking insulating layer patterns of the first and second memory cell transistors comprise a material selected from the group consisting of: $SiO_x/Si_xN_y/SiO_x$(ONO), $SiO_x$, $Si_xN_y$, $Al_2O_3$, $HfAlO_x$, HfAlON, $HfSiO_x$, HfSiON, and layered combinations thereof.

11. The memory cell of claim 1 wherein the control gates of the first and second memory cell transistors comprise a material selected from the group consisting of: polysilicon, polysilicon including metal silicide, metal silicide, metal nitride, and combinations thereof.

12. A non-volatile memory device comprising:
an array of memory cells arranged in rows and columns on a substrate;
a plurality of select transistors each extending in a column direction, each select transistor comprising: a common source line in the substrate, the common source line extending in the column direction across a plurality of rows of the memory cells; a gate dielectric line pattern on the common source line; and a select line on the gate dielectric line pattern, the select line extending in the column direction;
a plurality of first and second word lines extending in the column direction; each pair of first and second word lines at opposite sides of, and spaced apart from, a corresponding one of the select transistors;
wherein each memory cell comprises: first and second memory cell transistors on the substrate at opposite sides of one of the select transistors, each of the first and second memory cell transistors comprising: a tunnel insulating layer pattern; a charge storage layer pattern on the tunnel insulating layer pattern; a blocking insulating layer pattern on the charge storage layer pattern; and a control gate on the blocking insulating layer pattern, the control gate of the first memory cell transistor being coupled to the first word line and the control gate of the second memory cell transistor being coupled to the second word line; first and second floating junction regions in the substrate between the select transistor and the first and second memory cell transistors respectively; and first and second drain regions in the substrate at sides of the first and second memory cell transistors respectively opposite the first and second floating junction regions respectively; and
a plurality of bit lines extending in a row direction, each bit line being coupled to the first and second drain regions of the memory cells of a common row.

13. The memory device of claim 12 further comprising:
an insulating layer on the substrate, on the first and second memory cell transistors of the memory cells, and on the plurality of select transistors; and
a plurality of first and second contacts extending through the insulating layer contacting the first and second drain regions respectively of the memory cells, wherein the plurality of bit lines are formed on the insulating layer.

14. The memory device of claim 12 further comprising isolation regions in the substrate that isolate memory cells of neighboring rows.

15. The memory device of claim 12 wherein the first and second memory cell transistors of a memory cell are individually programmed by:
applying a program voltage to one of the first and second word lines corresponding to the one of the first and second memory cells to be programmed;
applying a zero voltage to the other of the first and second word lines corresponding to the other of the first and second memory cells;
applying a zero voltage to the select line of the select transistor corresponding to the memory cell of the one of the first and second memory cells to be programmed;
applying a ground voltage to the one of the plurality of bit lines coupled to the drain regions of the first and second memory cells;
applying a ground voltage to the common source line; and
applying a ground voltage to the substrate.

16. The memory device of claim 12 wherein the first and second memory cell transistors of a memory cell are individually erased by:
applying an erase voltage to one of the first and second word lines corresponding to the one of the first and second memory cells to be erased;
applying a zero voltage to the other of the first and second word lines corresponding to the other of the first and second memory cells;
applying a zero voltage to the select line of the select transistor corresponding to the memory cell of the one of the first and second memory cells to be erased;
applying a floating voltage to the one of the plurality of bit lines coupled to the drain regions of the first and second memory cells;
applying a ground voltage to the common source line; and
applying a ground voltage to the substrate.

17. The memory device of claim 12 wherein the first and second memory cell transistors of a memory cell are individually read by:
applying a reading voltage to one of the first and second word lines corresponding to the one of the first and second memory cells to be read;
applying a blocking voltage to the other of the first and second word lines corresponding to the other of the first and second memory cells;
applying the reading voltage or a voltage greater than the reading voltage to the select line of the select transistor corresponding to the memory cell of the one of the first and second memory cells to be read;
applying a voltage less than the reading voltage to the one of the plurality of bit lines coupled to the drain regions of the first and second memory cells;
applying a ground voltage to the common source line; and
applying a ground voltage to the substrate.

18. The memory device of claim 17 wherein the blocking voltage comprises a zero voltage.

19. The memory device of claim 17 wherein the blocking voltage comprises a voltage less than the zero voltage.

20. The memory device of claim 17 wherein the voltage less than the reading voltage applied to the one of the plurality of bit lines coupled to the drain regions of the first and second memory cells comprises approximately 0.5 volts.

* * * * *